United States Patent
Hautala et al.

(10) Patent No.: US 12,255,067 B2
(45) Date of Patent: Mar. 18, 2025

(54) METHOD FOR DEPOSITING LAYERS DIRECTLY ADJACENT UNCOVERED VIAS OR CONTACT HOLES

(71) Applicant: Applied Materials, Inc., Santa Clara, CA (US)

(72) Inventors: John Hautala, Beverly, MA (US); Charith Nanayakkara, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 428 days.

(21) Appl. No.: 17/751,609

(22) Filed: May 23, 2022

(65) Prior Publication Data

US 2023/0377888 A1 Nov. 23, 2023

(51) Int. Cl.
*H01L 21/00* (2006.01)
*H01L 21/033* (2006.01)

(52) U.S. Cl.
CPC .............................. *H01L 21/0337* (2013.01)

(58) Field of Classification Search
CPC ............. H01L 21/0337; H01L 21/7682; H01L 21/0226; H01L 21/02274
See application file for complete search history.

(56) References Cited

U.S. PATENT DOCUMENTS

| | | | | |
|---|---|---|---|---|
| 5,378,641 A * | 1/1995 | Cheffings | ............... | H10B 10/00 257/E27.098 |
| 5,858,845 A * | 1/1999 | Cheffings | .......... | H01L 21/76895 257/E21.59 |
| 6,271,565 B1 * | 8/2001 | Hook | ................ | H01L 21/26586 257/E21.345 |
| 6,746,924 B1 * | 6/2004 | Lee | ................. | H01L 21/823468 257/E21.345 |
| 9,997,351 B2 * | 6/2018 | Chen | ................. | H01L 21/02211 |
| 10,008,384 B2 * | 6/2018 | Ruffell | ................ | H01L 21/0337 |
| 10,269,561 B2 * | 4/2019 | Murakami | ........ | H01L 21/02592 |
| 10,607,847 B1 * | 3/2020 | Sung | ................ | H01L 29/66772 |
| 10,957,512 B1 * | 3/2021 | Evans | ..................... | H01J 37/20 |
| 11,043,380 B2 * | 6/2021 | Ruffell | ................ | H01L 21/3086 |
| 11,043,394 B1 * | 6/2021 | Hautala | ............. | H01L 21/68764 |
| 11,488,823 B2 * | 11/2022 | Ruffell | ................ | H01L 21/3086 |
| 11,569,095 B2 * | 1/2023 | Hautala | ................ | H01J 37/3053 |
| 11,908,691 B2 * | 2/2024 | Ruffell | ................ | H01L 21/0273 |
| 11,942,361 B2 * | 3/2024 | Saeedi Vahdat | ............................ | H01L 21/02274 |
| 2008/0020533 A1 * | 1/2008 | Thei | .................... | H01L 21/2658 257/E21.336 |

(Continued)

FOREIGN PATENT DOCUMENTS

JP 2009224492 A * 10/2009 ....... H01L 21/76898

*Primary Examiner* — Laura M Menz
(74) *Attorney, Agent, or Firm* — KDW FIRM PLLC (57) ABSTRACT

Disclosed are approaches for forming semiconductor device layers. One method may include forming a plurality of openings in a semiconductor structure, and forming a film layer atop the semiconductor structure by delivering a material at a non-zero angle relative to a normal extending perpendicular from an upper surface of the semiconductor structure. The film layer may be formed along the upper surface of the semiconductor structure without being formed along a sidewall of each opening of the plurality of openings, wherein an opening though the film layer remains above each opening of the plurality of openings.

17 Claims, 7 Drawing Sheets

(56) References Cited

U.S. PATENT DOCUMENTS

| | | | |
|---|---|---|---|
| 2008/0150037 A1* | 6/2008 | Teo | H01L 21/76224 257/E29.255 |
| 2014/0017817 A1* | 1/2014 | Godet | H01J 37/32357 438/3 |
| 2014/0080276 A1* | 3/2014 | Brand | H01L 29/66803 438/283 |
| 2016/0064026 A1* | 3/2016 | Arora | C23C 14/30 204/192.34 |
| 2016/0379816 A1* | 12/2016 | Ruffell | H01L 21/76816 |
| 2017/0162384 A1* | 6/2017 | Chen | C23C 16/513 |
| 2017/0178911 A1* | 6/2017 | Ma | H01L 21/76816 |
| 2017/0263460 A1* | 9/2017 | Ruffell | H01J 37/32403 |
| 2018/0330944 A1* | 11/2018 | Ruffell | H01L 21/0337 |
| 2020/0098589 A1* | 3/2020 | Ma | H01L 21/32139 |
| 2021/0090858 A1* | 3/2021 | Evans | G02B 5/1857 |
| 2021/0166936 A1* | 6/2021 | Ruffell | H01L 21/3086 |
| 2021/0189566 A1* | 6/2021 | Hautala | H01L 21/31144 |
| 2021/0193478 A1* | 6/2021 | Hautala | C23C 16/513 |
| 2021/0234091 A1* | 7/2021 | Kim | H10N 50/85 |
| 2021/0247554 A1* | 8/2021 | Meyer Timmerman Thijssen | H01J 37/3056 |
| 2021/0324519 A1* | 10/2021 | Hautala | H01J 37/32357 |
| 2021/0391155 A1* | 12/2021 | Campbell | H01J 37/32788 |
| 2022/0068923 A1* | 3/2022 | Zeeshan | C23C 16/045 |
| 2022/0119938 A1* | 4/2022 | Zeeshan | C23C 16/45525 |
| 2022/0399225 A1* | 12/2022 | Saeedi Vahdat | H01L 21/02274 |
| 2023/0020164 A1* | 1/2023 | Ruffell | H01L 21/76816 |
| 2023/0087442 A1* | 3/2023 | Hautala | H01L 21/76825 438/405 |
| 2023/0135735 A1* | 5/2023 | Hautala | H01J 37/32357 216/67 |
| 2023/0257872 A1* | 8/2023 | Saeedi Vahdat | C23C 28/04 427/248.1 |
| 2023/0335375 A1* | 10/2023 | Kurunczi | G02B 5/1857 |
| 2023/0360925 A1* | 11/2023 | Lin | H01L 21/31122 |
| 2023/0377888 A1* | 11/2023 | Hautala | H01L 21/0337 |
| 2023/0402284 A1* | 12/2023 | Hautala | G03F 7/20 |
| 2024/0096640 A1* | 3/2024 | Luan | H01L 21/31144 |
| 2024/0136197 A1* | 4/2024 | Andersen | H01L 21/31116 |
| 2024/0209497 A1* | 6/2024 | Park | C23C 16/56 |

* cited by examiner

METHOD FOR DEPOSITING LAYERS DIRECTLY ADJACENT UNCOVERED VIAS OR CONTACT HOLES

FIELD

Embodiments of the present disclosure generally relate to substrate processing equipment and techniques, and more particularly, to approaches for forming semiconductor device layers after formation of vias or contact holes using directional deposition.

BACKGROUND

As semiconductor technology advances, the market demands increasingly smaller chips with more structures per unit area. One class of device which has seen many advances in miniaturization is memory devices. The typical approach for 3D NAND memory devices, for example, is to stack more layers. Yet additional layers result in thicker stacks, which become difficult to etch accurately as the stack scales. For example, in current reactive ion etch (RIE) systems, it is challenging to maintain a resist thickness during a pattern transfer process involving multiple deposition and etch steps in which polymers from a plasma chemistry build up on the surface when little or no ion bias is applied. Oftentimes material is depositing into the holes. Furthermore, flakes or stringers of polymer may be produced, which affect the variability of the contact holes.

It is with respect to these and other considerations that the present disclosure is provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In some approaches, a method may include forming a plurality of openings in a semiconductor structure, and forming a film layer atop the semiconductor structure by delivering a material at a non-zero angle relative to a normal extending perpendicular from an upper surface of the semiconductor structure. The film layer may be formed along the upper surface of the semiconductor structure without being formed along a sidewall of each opening of the plurality of openings, wherein an opening though the film layer remains above each opening of the plurality of openings.

In some approaches, a method of forming a semiconductor device having a plurality of vias may include forming the plurality of vias through the semiconductor device, and forming a film layer atop the semiconductor structure by delivering a ribbon beam of material at a non-zero angle relative to a normal extending perpendicular from an upper surface of the semiconductor structure. The film layer may be formed along the upper surface of the semiconductor structure without being formed along a sidewall of each via of the plurality of vias, wherein an opening though the film layer remains above each via of the plurality of vias.

In some approaches, a method of forming a memory hole in a semiconductor device may include forming a plurality of openings in a semiconductor structure, and delivering a ribbon beam of material from a plasma source to the semiconductor structure to form a film layer atop an upper surface of the semiconductor structure, wherein the ribbon beam of material is delivered at a non-zero angle relative to a normal extending perpendicular from the upper surface of the semiconductor structure, wherein the film layer is formed atop the upper surface of the semiconductor structure, directly adjacent the plurality of openings, without being formed along a sidewall of each opening of the plurality of openings, and wherein an opening though the film layer remains above each opening of the plurality of openings.

BRIEF DESCRIPTION OF THE DRAWINGS

By way of example, embodiments of the disclosure will now be described, with reference to the accompanying drawings, in which.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, structures, and systems in accordance with the present disclosure will now be described more fully hereinafter with reference to the accompanying drawings, where embodiments are shown. The methods, devices, structures, and systems may be embodied in many different forms and are not to be construed as being limited to the embodiments set forth herein. Instead, these embodiments are provided so the disclosure will be thorough and complete, and will fully convey the scope of the methods, devices, structures, and systems to those skilled in the art.

Embodiments described herein generally relate to improved techniques for forming semiconductor structures including openings (e.g., vias or contact holes). In traditional approaches, etching of contact holes and vias with precise critical dimensions (CDs) and low variability is difficult with thin resists, such as EUV resists less than 35 nm. Etching deep holes (e.g., greater than 50 nm) also requires good etch selectivity to the resist, which may be difficult in many cases. Printing thicker resists is often not desirable. Instead, adding film to the resist thickness without changing the CD is advantageous.

As will be described herein, the present disclosure provides novel techniques for depositing a film, such as a photoresist or hardmask, atop a structure having a plurality of openings formed therein using directional deposition of the film, and which provides little or no change to the diameter of each of the openings. Furthermore, the angled deposition prevents the film from being deposited within the openings. In some embodiments, a ribbon beam is used to build up a film on a device layer (e.g., patterned film) while controllably varying the CD of the openings, including maintaining the original diameter(s).

In one non-limiting example, a carbon (C) or silicon (Si)-based film may be deposited at a non-zero angle relative to a normal extending perpendicular from a surface of the photoresist or hardmask, which has holes patterned therein. For maintaining uniform, circular holes, the deposition may be at least every 90 degrees, which translates to a minimum of four rotations for a single ribbon beam. In other embodiments using a dual beam process, a minimum of a single 90-degree rotation may be required. Deposition of a photoresist film may be performed at less than 120° C., but could be higher for other films.

Figure 1A:
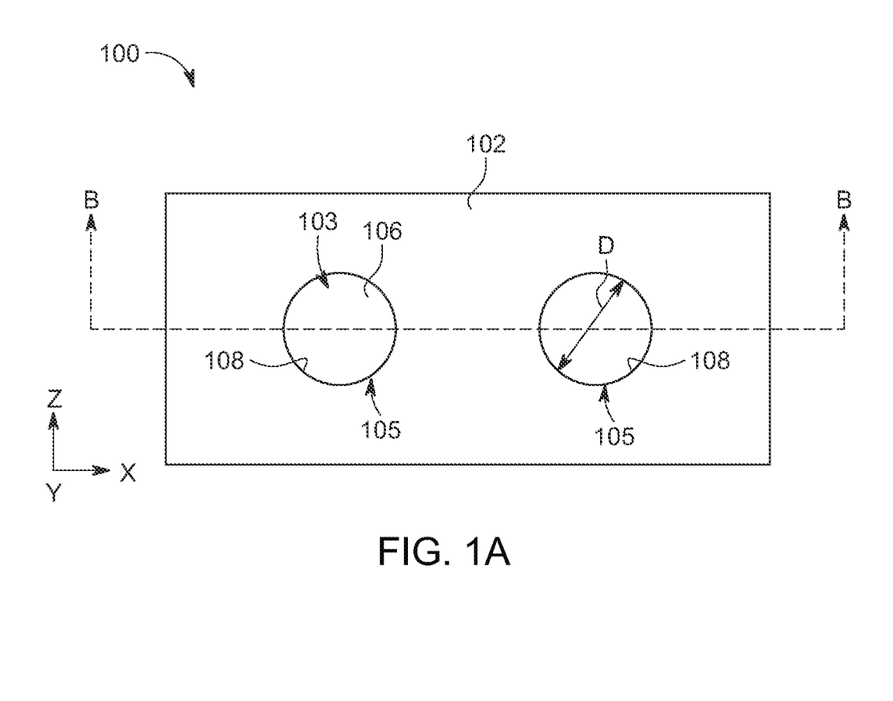
FIG. 1A depicts a top view of an exemplary semiconductor structure including a plurality of vias or contact holes, in accordance with embodiments of the present disclosure.
Figure 1B:
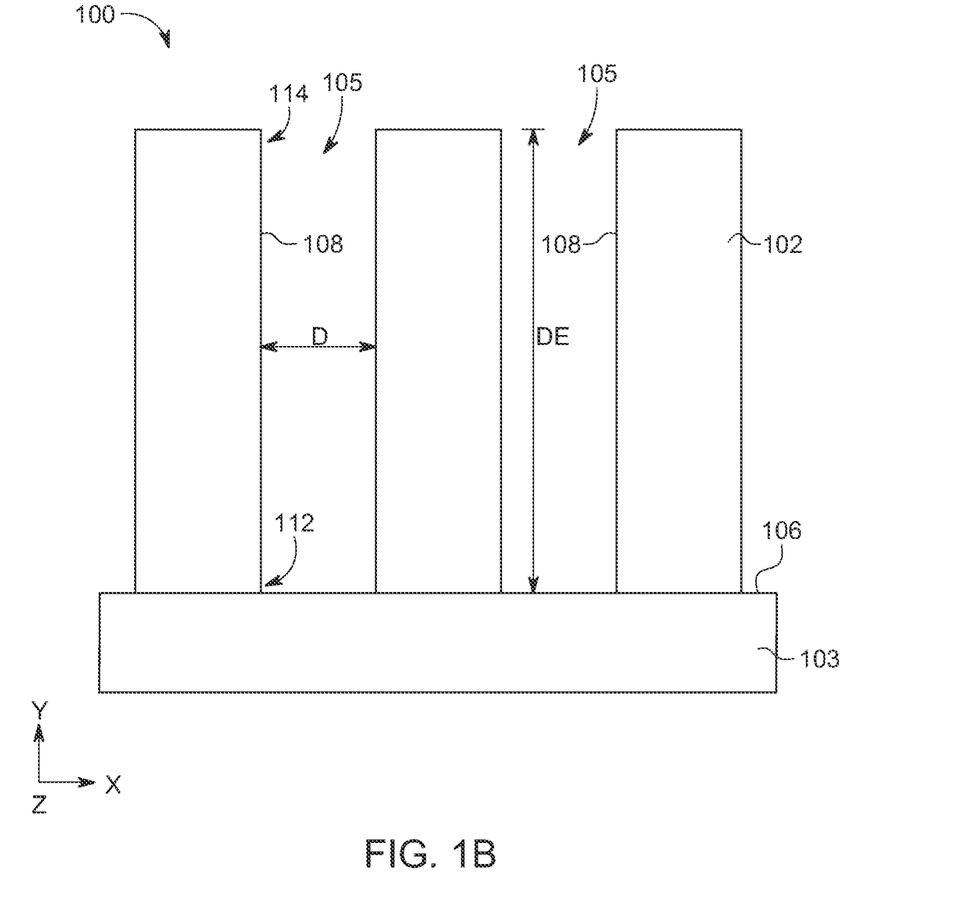
FIG. 1B depicts a side cross-sectional view along cutline B-B in FIG. 1A, in accordance with embodiments of the present disclosure.

FIGS. 1A-1B demonstrate a semiconductor device or structure 100, according to embodiments of the disclosure. Although non-limiting, the structure 100 may be a memory device (e.g., NAND or DRAM), logic device, or other type of semiconductor device. As shown, the structure 100 may include a patterned layer 102 formed over a second device layer 103, wherein the patterned layer 102 may be a photoresist or hardmask with a plurality of openings (e.g., vias or contact holes) 105 formed therein. In some embodiments, the openings 105 are formed selective to a top surface 106 of the second device layer 103. Although only a pair of openings 105 are shown to simplify explanation of the structure 100, it will be appreciated that many additional openings 105 may be present across the structure 100.

Each of the openings 105 may be defined by a cylindrically shaped inner sidewall 108 having a diameter 'D'. In some embodiments, the diameter may be constant, or substantially constant, between a lower portion 112 and an upper portion 114 of each opening 105. In other embodiments, the diameter may vary between the lower portion 112 and the upper portion 114. Although not limited to specific shapes/dimensions, in some embodiments, a depth 'DE' of the openings 105 may be between 15-100 nm, while the diameter may be between 10-100 nm.

Figure 2A:
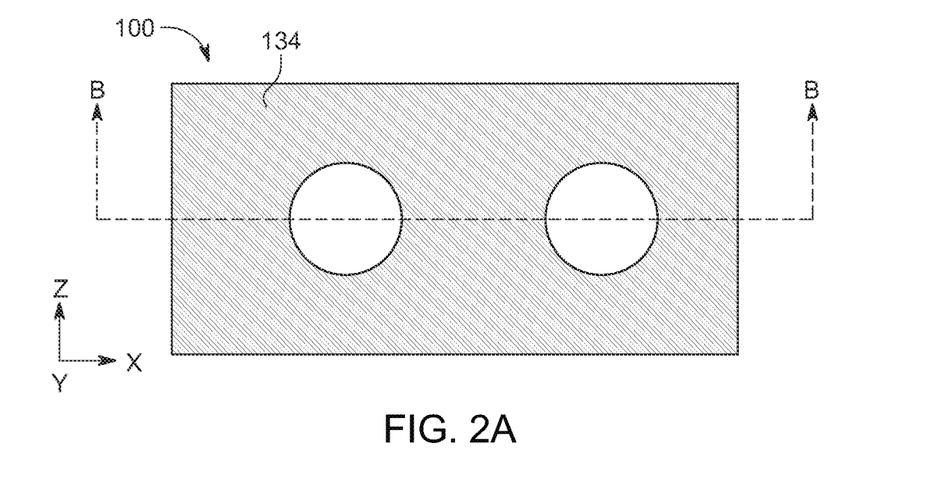
FIG. 2A depicts a top view of the exemplary semiconductor structure, in accordance with embodiments of the present disclosure.
Figure 2B:
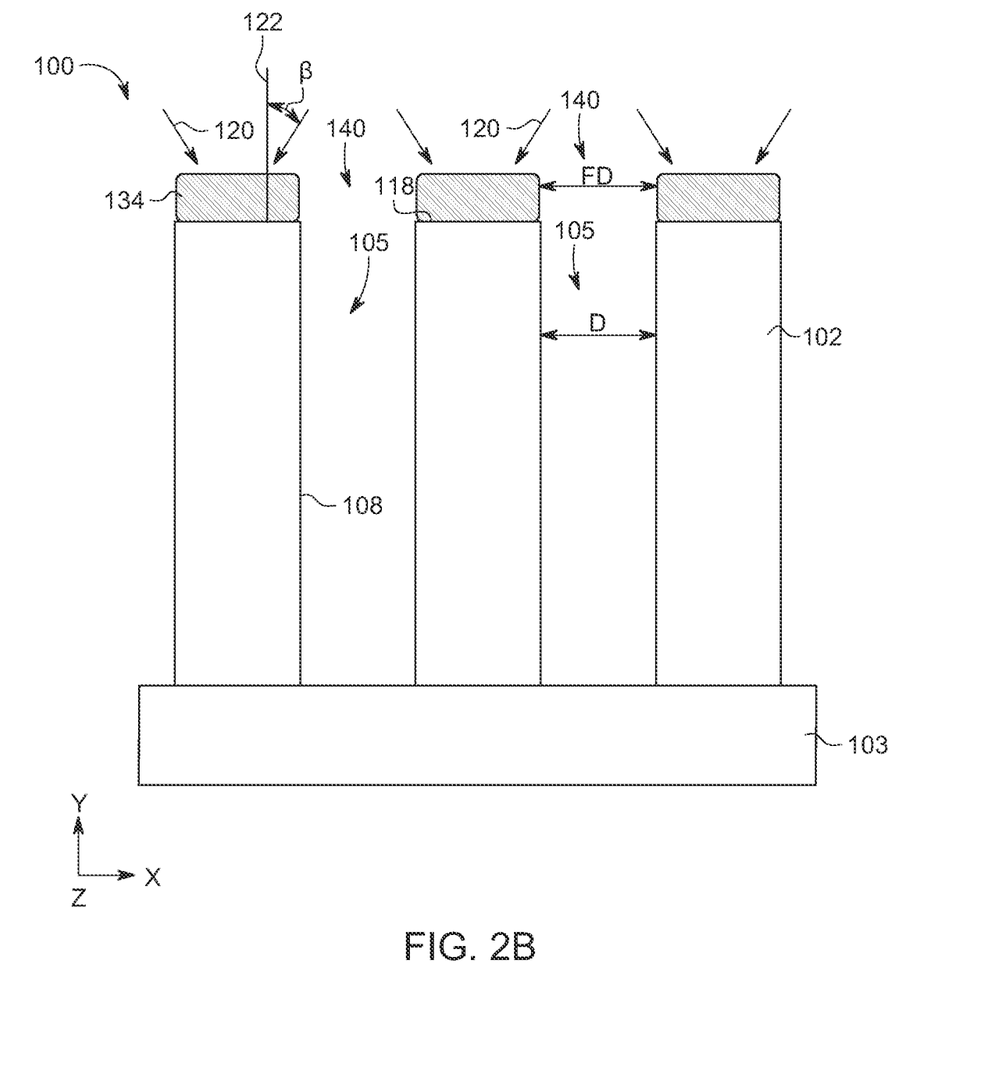
FIG. 2B depicts a side cross-sectional view along cutline B-B in FIG. 2A, in accordance with embodiments of the present disclosure.
Figure 2C:
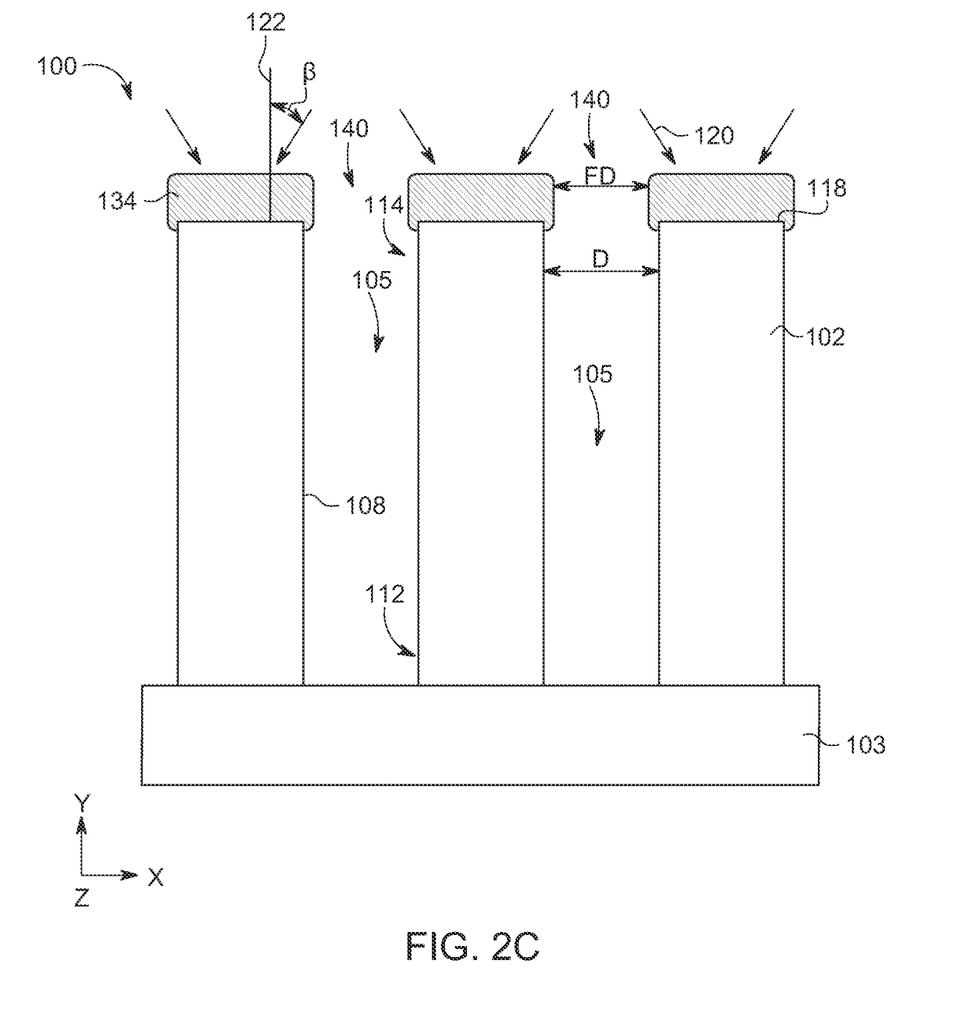
FIG. 2C depicts a side cross-sectional view along cutline B-B in FIG. 2A, in accordance with embodiments of the present disclosure.

As shown in FIGS. 2A-2C, a film layer 134 may be formed over the structure 100, including along an upper surface 118 thereof. In some embodiments, the film layer 134 may be formed by delivering a material 120 at non-zero angle 'β' relative to a perpendicular 122 extending from the upper surface 118. In some embodiments, the material 120 is delivered as a ribbon beam in a series of successive deposition steps performed in between rotations of the structure 100 and/or a deposition tool. For example, the material 120 may be deposited every 90 degrees, which equates to at least four rotations for a single ribbon beam. For material deposited every 45 degrees, eight rotations for a single ribbon beam may be required. In other embodiments, e.g., using a dual beam process, a minimum of a single 90-degree rotation may be required. Embodiments herein are not limited in this context.

In exemplary embodiments, the film layer 134 may be deposited while the openings 105 are uncovered. Advantageously, the non-zero angle of material delivery prevents the film layer 134 from being formed along the inner sidewall 108 or the bottom of each opening 105. Instead, the film layer 134 is formed only atop the upper surface 118, directly adjacent the openings 105, to permit a film opening 140 to remain through the film layer 134 above each opening 105. In some embodiments, a thickness (e.g., along the y-direction) of the film layer is greater than 40 nm.

In the embodiment of FIG. 2B, the film openings 140 may be similarly dimensioned to the openings 105 along the upper portions 114 thereof. More specifically, a first film diameter 'FD' of the film openings 140 may be the same, or substantially the same, as the diameter of the openings 105 adjacent the upper surface 118. In the embodiment of FIG. 2C, a second film diameter 'FD' of the film openings 140 may be less than the diameter of the openings 105 adjacent the upper surface 118. By changing the deposition angle β, the CD (e.g., film diameter) may be reduced, as desired.

In various embodiments, the material 120 may include carbon, amorphous silicon, silicon dioxide, silicon nitride, silicon carbide, silicon carbonitride, a boron-carbon film, or a tungsten-carbon film. Furthermore, the material 120 may be the same or different than the material of the patterned layer 102. When the film layer 134 is a photoresist film, deposition may be performed at less than 120° C. Other materials may be deposited at higher temperatures, however. In some examples, the structure 100 may be positioned atop a platen or wafer support, which may be heated to a desired temperature.

Figure 3:
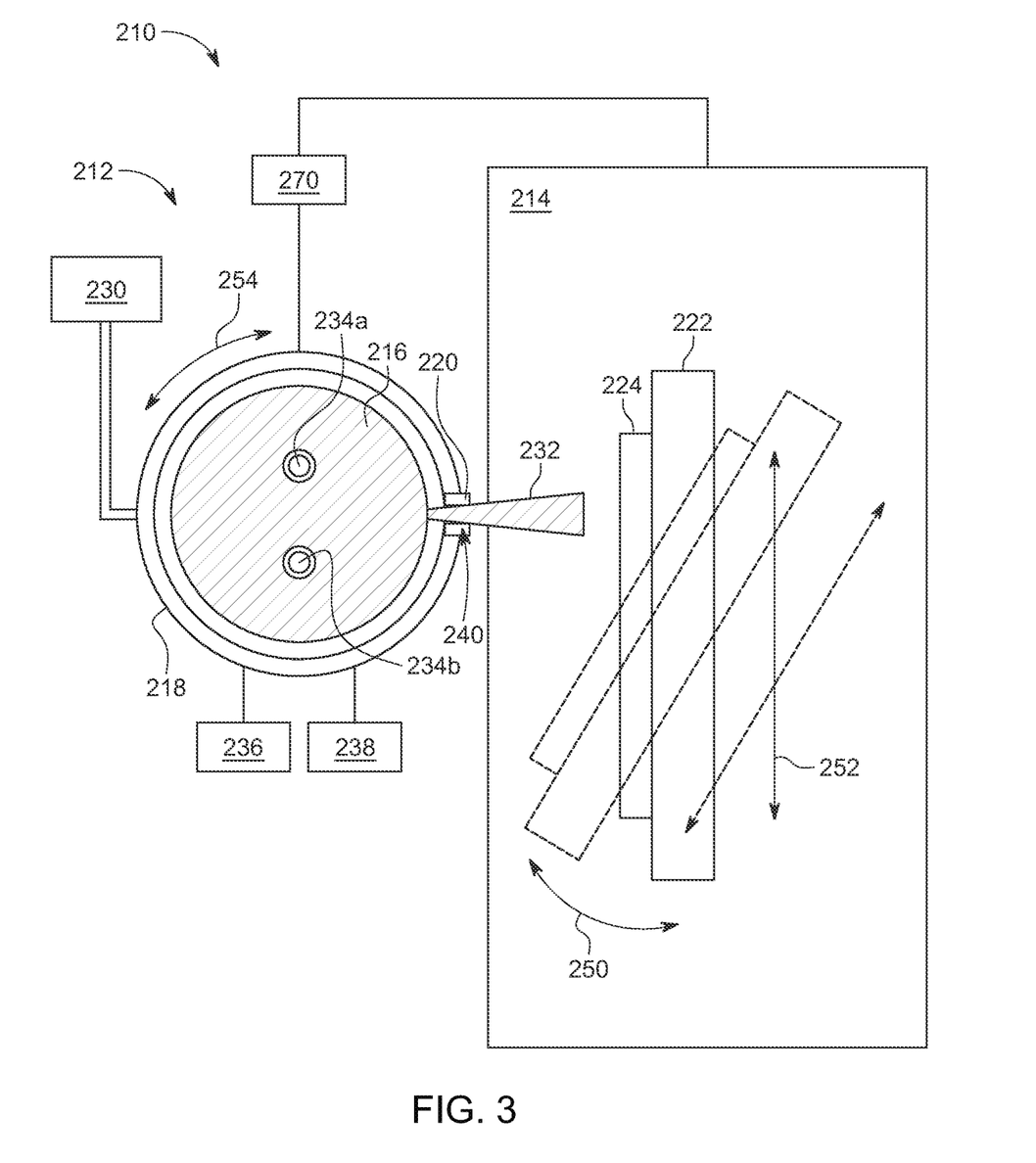
FIG. 3 is a schematic diagram of a system for forming the device structure, in accordance with embodiments of the present disclosure.

FIG. 3 illustrates a portion of a system 210 useful to perform processes described herein, such as deposition of the material 120 to form the film layer 134. The system 210 may generally include a plasma source 212 disposed adjacent a process chamber 214. The plasma source 212 may be adapted to generate an energetic plasma 216 in a plasma chamber 218, and to emit the plasma 216, e.g., through a nozzle 220 of the plasma chamber 218. In other embodiments, the plasma 216 may be delivered through a second plate (not shown) with a separate aperture situated a specific distance away from the plasma chamber 218. While the plasma chamber 218 is depicted as being generally cylindrical in shape, the present disclosure is not limited in this regard, and the plasma chamber 218 may be implemented in a variety of alterative shapes and configurations.

The process chamber 214 may contain a platen or wafer support 222 adapted to support a substrate 224 (e.g., a silicon wafer) in a confronting relationship with the nozzle 220 of the plasma chamber 218. In various embodiments, the platen 222 may be adapted to forcibly retain the substrate 224, such as via electrostatic clamping or mechanical clamping. Additionally, the platen 222 may include a heating element (not shown) for controllably heating the substrate 224 to a desired temperature (e.g., a temperature in a range between room temperature and 450 degrees Celsius) to enhance deposition processes.

The plasma source 212 of the system 210 may be configured to generate the plasma 216 from a gaseous species supplied to the plasma chamber 218 by one or more gas sources 230. The gaseous species may include one or more of $SiH_4$, $CH_4$, $NH_3$, $O_2$, $N_2$, $SiCl_4$, $GeH_4$, Ar, $WF_6$, $B_2H_6$, etc. The present disclosure is not limited in this regard. The plasma 216 may be projected through the nozzle 220 in the form of a ribbon beam 232 directed at the substrate 224 as further described below. In various embodiments, the plasma source 212 may be a radio frequency (RF) plasma source (e.g., an inductively coupled plasma (ICP) source, a capacitively coupled plasma (CCP) source, a helicon source, an electron cyclotron resonance (ECR) source, etc.). For example, the plasma source 212 may include electrodes 234a, 234b, an RF generator 236, and an RF matching network 238 for igniting and sustaining the plasma 216 in a manner familiar to those of ordinary skill in the art. The present disclosure is not limited in this regard.

The plasma 216 generated in the plasma chamber 218 may contain ionized gas species (ions), electrons, excited neutrals, and free radicals. In conventional plasma enhanced chemical vapor deposition (PECVD) systems, a substrate is located in the same chamber as a plasma, and free radicals within the plasma are distributed over the surface of the substrate in a directionally-nonspecific, isotropic manner to form a thin film of generally uniform thickness on the exposed surface(s) of the substrate. By contrast, the plasma chamber 218 of the system 210 is separate from the process chamber 214 where the platen 222 and the substrate 224 reside, and a collimated ribbon beam 232 containing free radicals of the plasma 216 is extracted from the plasma chamber 218 and is directed at the substrate 224 in a directionally specific, anisotropic manner. This is achieved by establishing a pressure differential between the plasma chamber 218 and the process chamber 214, and by collimating the radical beam.

In a non-limiting example, the radical beam may be extracted through a nozzle 220 or a second aperture plate having an elongated profile. With regard to the pressure differential, the process chamber 214 may be maintained at a first pressure, and the plasma chamber 218 may be maintained at a second pressure higher than the first pressure. In various examples, the first pressure in the process chamber may be in a range of $10^{-6}$ torr to $10^{-2}$ torr, and the second pressure in the plasma chamber 218 may be in a range of 1 millitorr to 1 torr. The present disclosure is not limited in this regard. Thus, the pressure differential between the plasma chamber 218 and the process chamber 214 may provide a motive force for driving free radicals in the plasma 216 from the plasma chamber 218 into the process chamber 214 in the form of ribbon beam 232.

The ribbon beam 232 may be given its shape and may be collimated using various structures, devices, and techniques. In one example, the ribbon beam 232 may be given its shape and may be collimated by the elongated, low-profile nozzle 220 of the plasma chamber 218 or alternatively with a second plate set a specific distance away from 218 with a second aperture slot.

The platen 222 may be rotatable and movable for pivoting and scanning the substrate 224 relative to the plasma chamber 218 as indicated by arrows 250 and 252. Additionally, or alternatively, the plasma chamber 218 may be rotatable about its long axis as indicated by the arrow 254. Thus, the collimated, free radical-containing ribbon beam 232 may be projected onto the substrate 224 at various oblique angles in a highly directional, anisotropic manner to deposit films on specific sides and/or portions of surface features (e.g., such as the upper surface 118 of the structure 100) of the substrate 224 while keeping other sides and/or portions of such surface features free of such depositions (e.g., the inner sidewall 108 of the openings 105). In a non-limiting example, the movement and/or rotation of the platen 222 and/or the plasma chamber 218 may facilitate projecting the ribbon beam 232 onto the substrate 224 at angles in a range of 10 degrees to 80 degrees relative to a surface of the platen 222 with angle spreads in a range of +/−5 degrees to +/−30 degrees.

Figure 4:
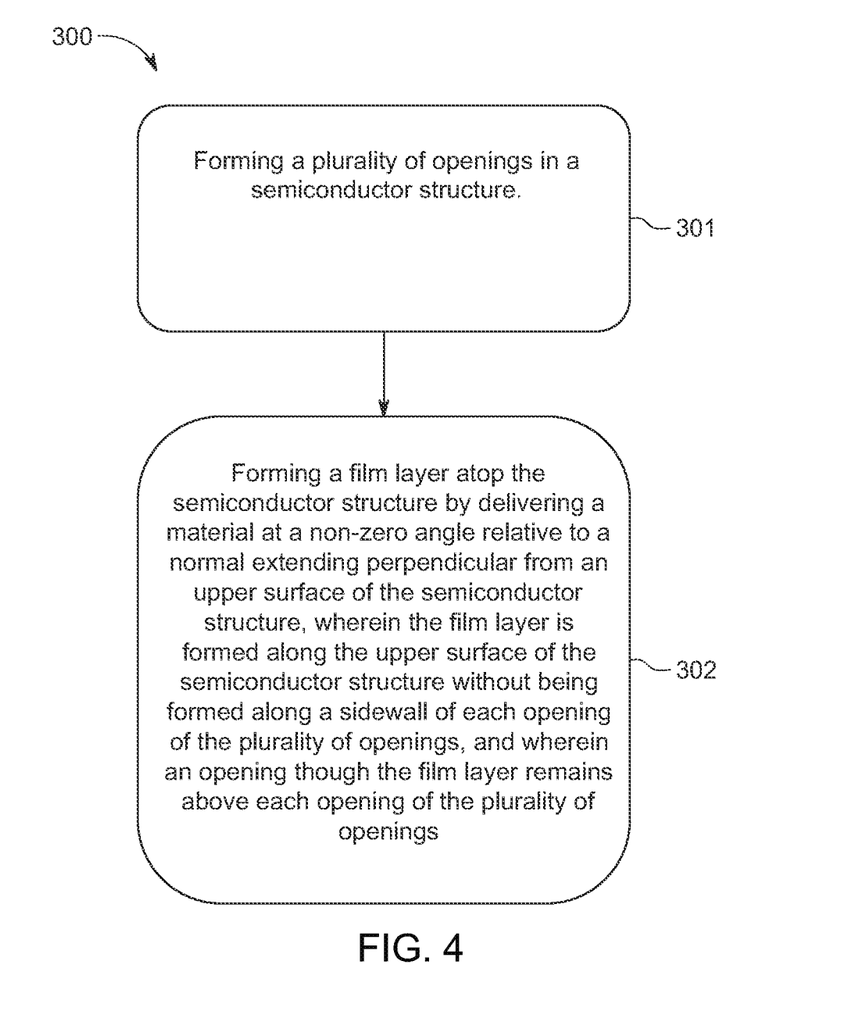
FIG. 4 is a flowchart depicting a method, in accordance with embodiments of the present disclosure.

Turning now to FIG. 4, a method 300 of forming a semiconductor structure according to embodiments of the present disclosure will be described. At block 301, the method may include forming a plurality of openings in a semiconductor structure. In some embodiments, the openings are vias or contact openings of an EUV resist or hardmask. The openings may be formed by any variety of known methods.

At block 302, the method 300 may include forming a film layer atop the semiconductor structure by delivering a material at a non-zero angle relative to a normal extending perpendicular from an upper surface of the semiconductor structure, wherein the film layer is formed along the upper surface of the semiconductor structure without being formed along a sidewall of each opening of the plurality of openings, and wherein an opening though the film layer remains above each opening of the plurality of openings. Said another way, the film layer does not fully enclose or cap the openings.

In some embodiments, the material is delivered while the plurality of openings are uncovered. In other words, the openings are not enclosed or capped prior to deposition of the material. In some embodiments, the material is delivered as a ribbon beam. In some embodiments, the material is delivered in a series of successive deposition steps, wherein the semiconductor structure is rotated between one or more of the series of successive deposition steps. In some embodiments, the semiconductor structure is rotated 90 degrees or less between each of the series of successive deposition steps.

In some embodiments, each opening of the plurality of openings has a first diameter at the upper surface of the semiconductor structure, wherein the opening though the film layer above each opening of the plurality of openings has a second diameter. In some embodiments, the first diameter is substantially the same as the second diameter following formation of the film layer. In other embodiments, the first diameter is less than the second diameter.

In some embodiments, delivering the material at the non-zero angle includes depositing at least one of the following along the upper surface of the semiconductor structure: carbon, amorphous silicon, silicon dioxide, silicon nitride, silicon carbide, silicon carbonitride, a boron-carbon film, or a tungsten-carbon film.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   forming a plurality of openings in a semiconductor structure, wherein the semiconductor structure comprises a photoresist; and
   forming a film layer directly atop the photoresist by delivering a material at a non-zero angle relative to a normal extending perpendicular from an upper surface of the semiconductor structure, wherein the film layer is formed along the upper surface of the photoresist without being formed along a sidewall of each opening of the plurality of openings, and wherein an opening though the film layer remains above each opening of the plurality of openings.

2. The method of claim 1, wherein the material is delivered while the plurality of openings are uncovered.

3. The method of claim 1, wherein the material is delivered as a ribbon beam.

4. The method of claim 1, further comprising delivering the material in a series of successive deposition steps, wherein the semiconductor structure is rotated between one or more of the series of successive deposition steps.

5. The method of claim 1, wherein the semiconductor structure is rotated 90 degrees or less between each of the series of successive deposition steps.

6. The method of claim 1, wherein each opening of the plurality of openings has a first diameter at the upper surface of the photoresist, wherein the opening though the film layer above each opening of the plurality of openings has a second diameter, wherein the first diameter is substantially the same as the second diameter following formation of the film layer.

7. The method of claim 1, wherein delivering the material at the non-zero angle comprises depositing at least one of the following along the upper surface of the photoresist: carbon, amorphous silicon, silicon dioxide, silicon nitride, silicon carbide, silicon carbonitride, a boron-carbon film, or a tungsten-carbon film.

8. The method of claim 1, further comprising generating the material in a plasma chamber.

9. A method of forming a semiconductor device having a plurality of vias, the method comprising:
   forming the plurality of vias through the semiconductor device, wherein the semiconductor structure comprises a photoresist;
   forming a film layer directly atop the photoresist by delivering a ribbon beam of material at a non-zero angle relative to a normal extending perpendicular from an upper surface of the photoresist, wherein the film layer is formed along the upper surface of the photoresist without being formed along a sidewall of each via of the plurality of vias, and wherein an opening though the film layer remains above each via of the plurality of vias.

10. The method of claim 9, wherein the ribbon beam of material is delivered while the plurality of vias are uncovered.

11. The method of claim 9, wherein the ribbon beam of material is delivered at a temperature less than 120° C.

12. The method of claim 9, further comprising delivering the ribbon beam of material in a series of successive deposition steps, wherein the semiconductor structure is rotated between one or more of the series of successive deposition steps.

13. The method of claim 9, wherein each via of the plurality of vias has a first diameter at the upper surface of the photoresist, wherein the opening though the film layer above each via of the plurality of vias has a second diameter, and wherein, following formation of the film layer, the first diameter is substantially the same as the second diameter.

14. The method of claim 9, wherein delivering the ribbon beam of material at the non-zero angle comprises depositing at least one of the following along the upper surface of the photoresist: carbon, amorphous silicon, silicon dioxide, silicon nitride, silicon carbide, silicon carbonitride, a boron-carbon film, or a tungsten-carbon film.

15. The method of claim 9, further comprising delivering the ribbon beam of material from a plasma chamber.

16. A method of forming a memory device, comprising:
   forming a plurality of openings in a semiconductor structure, wherein the semiconductor structure comprises a photoresist; and
   delivering a ribbon beam of material from a plasma source to the semiconductor structure to form a film layer directly atop an upper surface of the photoresist, wherein the ribbon beam of material is delivered at a non-zero angle relative to a normal extending perpendicular from the upper surface of the photoresist, wherein the film layer is formed atop the upper surface of the photoresist, directly adjacent the plurality of openings, without being formed along a sidewall of each opening of the plurality of openings, and wherein an opening though the film layer remains above each opening of the plurality of openings.

17. The method of claim 16, wherein each opening of the plurality of openings has a first diameter at the upper surface of the photoresist, wherein the opening though the film layer above each opening of the plurality of openings has a second diameter, and wherein, following formation of the film layer, the first diameter is substantially the same as the second diameter.

* * * * *